United States Patent [19]

Barrett et al.

[11] Patent Number: 5,746,827
[45] Date of Patent: May 5, 1998

[54] METHOD OF PRODUCING LARGE DIAMETER SILICON CARBIDE CRYSTALS

[75] Inventors: Donovan L. Barrett, New Smyrna Beach, Fla.; Richard N. Thomas, Murrysville, Pa.; Raymond G. Seidensticker, deceased, late of Forest Hills, Pa., by Joan Seidensticker, heir; Richard H. Hopkins, Murrysville, Pa.

[73] Assignee: Northrop Grumman Corporation, Los Angeles, Calif.

[21] Appl. No.: 579,277

[22] Filed: Dec. 27, 1995

[51] Int. Cl.$^6$ .................................................. C30B 23/00
[52] U.S. Cl. .................................................. 117/100; 117/84
[58] Field of Search .................................. 117/2, 98, 99, 117/101, 105, 107, 84, 100

[56] References Cited

U.S. PATENT DOCUMENTS

| Re. 34,861 | 2/1995 | Davis et al. | 117/105 |
|---|---|---|---|
| 2,854,364 | 9/1958 | Lely | 117/84 |
| 3,520,740 | 7/1970 | Addamiano | 117/97 |
| 4,175,291 | 11/1979 | Spence | 365/184 |
| 4,183,040 | 1/1980 | Rideout | 257/300 |
| 4,864,380 | 9/1989 | Plus et al. | 257/351 |
| 4,866,005 | 9/1989 | Davis et al. | 117/98 |
| 5,211,801 | 5/1993 | Stein | 117/84 |
| 5,549,749 | 8/1996 | Asai | 117/106 |

FOREIGN PATENT DOCUMENTS

| 094023096 A1 | 10/1994 | Germany | 117/200 |
|---|---|---|---|
| 000730665 | 5/1955 | United Kingdom | 117/12 |

OTHER PUBLICATIONS

"General Principles of Growing Large–Size Single Crystals of Various Silicon Carbide Polytypes", Yu.M. Tairov, V.F. Tsvetkov Journal of Crystal Growth, pp. 146–150 1981.

"Investigation of Growth Processes of Ingots of Silicon Carbide Single Crystals", Yu.M. Tairov, V.F. Tsvetkov, Journal of Crystal Growth, pp. 209–212 (1978).

"Bulk and Perimeter Generation in 6H–SiC Diodes", J.A. Cooper, Jr. J.W. Palmout, C.T. Gardner, M.R. Melloch, C.H. Carter, Jr. International Semiconductor Device Research Symposium, Charlottesville, VA. Dec. 1991.

"Darstellung von Einkristallen von Siliciumearbid und Beherrschung von Art and Menge der eingebauten Verunremigungen" by J.A. Lely, Ber. Deut. Keram. Ges., 32 (1955), pp. 229–231.

"Growth Phenomena in Silicon Carbide" by W.F. Knippenberg, Philips Research Reports, vol., 18, No. 3, Jun. 1963.

*Primary Examiner*—Felisa Garrett
*Attorney, Agent, or Firm*—Walter G. Sutcliff

[57] ABSTRACT

A method for producing crystals of silicon carbide in a furnace. The furnace has a crucible with a cavity in which the cavity has first and second spaced-apart regions. The crucible cavity of the furnace is capable of being heated, preferably by induction or resistance heating, with insulation placed around the crucible and crucible cavity. A source material of silicon carbide is provided at the first region of the crucible cavity, and a monocrystalline seed is placed at the second region of the crucible cavity. A first growth stage is then conducted in which the first region and the second region of the crucible cavity are heated to at least the sublimation temperature of silicon carbide under substantially isothermal conditions. Then, a second growth stage is conducted in which a temperature gradient is provided between the first and the second region of the crucible cavity, such that the seed in the second crucible region is kept at a temperature lower than a temperature of the first crucible region.

14 Claims, 1 Drawing Sheet

METHOD OF PRODUCING LARGE DIAMETER SILICON CARBIDE CRYSTALS

BACKGROUND OF THE INVENTION

1. Field of the Invention

The present invention relates to methods for producing large, single crystals of silicon carbide with crystalline quality suitable for use in semiconductor devices.

2. Description of the Prior Art

Single crystal silicon carbide is a wide bandgap semiconductor material with physical and chemical properties unmatched for high power microwave, temperature tolerant, and radiation resistant applications. For example, silicon carbide exhibits a critical electric-field breakdown strength of approximately ten times that of silicon, the most commonly used semiconductor material. Also, silicon carbide has a high-field electron velocity equal to gallium arsenide, a semiconductor material commonly utilized for its high electron velocity property. Further, silicon carbide exhibits a thermal conductivity near that of copper, a value higher than either silicon or gallium arsenide, which provide an advantageous property in the operation of certain semiconductor-based devices. Silicon carbide based microwave transistors and integrated circuits could provide approximately five times the power density of gallium arsenide based MMIC's at X-band frequencies and approximately ten times the power density of silicon at UHF-band to s-band frequencies.

A basic requirement for the use of silicon carbide as a semiconductor material is that the silicon carbide be prepared as large single crystals. The large single crystals should be prepared with a size sufficient for economic applications and have a structure consisting of a repeated atomic arrangement with a minimum of defects in the periodic array.

Single crystals of silicon carbide were first obtained as platelets found within cavities in the large Acheson furnaces used to produce silicon carbide grain. Although these platelets were initially used to assess the physical characteristics of single crystal silicon carbide, since there was no control of the platelet growth process they were, in general, found to be crystallographically defective.

The first single crystals were grown in the laboratory by a sublimation vapor-condensation growth technique by J. A. Lely that was reported in Ber. Deut. Keram, Ges., 32 (1955) pp. 229–251 and described in U.S. Pat. No. 2,845,364. In this technique, Lely constructed an artificial cavity with pieces of silicon carbide from the Acheson process, placed this charge with cavity into a graphite crucible, and heated this charge to above 2500° C. in an inert argon atmosphere where vapors from the subliming charge condensed at random sites within the cooler cavity wall to form platelets of silicon carbide.

Between 1958 and 1978, a number of investigators expended a large amount of activity in an attempt to control the sublimation-vapor transport process and improve the size and quality of the grown platelets. However, the essential drawbacks to the Lely process—uncontrolled nucleation of multiple intergrown platelets, the small size of platelets, and non-uniform growth rate of individual platelets—were not overcome. In addition, the silicon carbide platelets were frequently found to be grown as layers of different crystalline polytype. While the different polytypes exhibit nearly identical physical properties, a significant difference may be observed in the electrical and optical properties between each polytype. Single-crystal, single-polytype silicon carbide material is required for efficient device fabrication, since the occurrence of random polytypes within the crystal will adversely affect the electronic properties of devices fabricated on them.

The growth of cylindrical single-crystal silicon carbide boules was first described by Yu. M. Tairov and V. F. Tsvetkov in J. Crystal Growth 43, (1978) pp. 209–212, in which small ingots 8-mm in diameter and 8-mm in length were grown. This development incorporates a seed crystal in order to control nucleation, and in this manner, is similar to the growth techniques used to grow single crystals of silicon. In this technique, as described by Yu. M. Tairov and V. F. Tsvetkov, in J. Crystal Growth 52 (1981) pp. 146–150, a graphite crucible is used where a single crystal seed placed in one portion of the crucible is separated from silicon carbide grain placed in another portion of the crucible. The seed temperature is raised to a temperature of 1800°–2000° C. and the source temperature raised to a higher temperature than the seed, and sufficient to provide a temperature gradient of about 30° C./cm between the source and seed. Nucleation of growth on the seed surface was effected under approximately 100 torr pressure of argon to stabilize the polytypic structure of the deposition. The growth rate was then slowly increased by evacuating the system to a pressure of $10^{-1}$–$10^{-4}$ torr according to an exponential law with a time constant of approximately 7 minutes. Mass transfer is effected by the fluxes of the gas phase components Si, $Si_2C$, and $SiC_2$ formed as a result of decomposition of the SiC source material.

Tairov and Tsvetkov further noted that the vapor pressure of Si exceeds the vapor pressure of $Si_2C$ and $SiC_2$, and reacts with the graphite walls of the growth cell. Growth at source-to-seed separations of greater than 10 mm was obtained as the silicon vapor acted as a transporting agent with the graphite cell being the carbon source. Tairov and Tsvetkov also suggested that it is possible to control the polytypic structure of the growth by selecting seeds of the required polytype, or by growing the crystal on faces which form an angle to the (0001) surface. To grow polytypic homogeneous crystals, Tairov and Tsvetkov noted that it is also necessary to eliminate supersaturation fluctuations during crystal growth.

The production of 6H-polytype single crystal boules up to 20 mm in diameter and 24 mm in length suitable for use as blue light emitting diode substrate material was reported by Ziegler et al., in IEEE Trans. Electron. Dev., ED-30, 4 (1983) pp. 277–271, and described in German patent DE 3,230,727. Ziegler et al., referred to this process as the "modified Lely technique". The process described by Ziegler et al. is based on the knowledge that the Tairov method produced crystals with mixed polytypes due to the following: the temperature gradient was too high, the pressure of the protective gas was too low, and the temperature of the seed should be selected in accord with the vapor pressure diagram given by Knippenberg in *Growth Phenomena in Silicon Carbide*, Philips Res. Repts. 18, (1963) pp. 164–166.

The process described by Ziegler et al. limits the temperature gradient in the direction of epitaxial growth to no more than 25° C./cm, holds the temperature of the seed crystal to a range of 2100°–2300° C., and adjusts the pressure of the protective gas to be at least as high as the total of the partial pressures of the deposition components. Ziegler et al. described a purportedly advantageous arrangement of the sublimation growth crucible by placing porous graphite in the growth cavity between the source grain and the seed crystal. A temperature gradient is provided by additional heating of the source end of the crucible, or by additional cooling of the seed end of the crucible.

U.S. Pat. No. 4,886,005 to Davis et al., provides a method of reproducibly controlling the growth of large single crystals of silicon carbide using the physical vapor growth technique. According to Davis et al., controlled repeatable growth of silicon carbide of desired polytype is achieved by generating and maintaining a substantially constant flow of vaporized Si, $Si_2C$ and $SiC_2$ per unit area per unit time from the source to the growth surface of the seed crystal. To maintain this constant flow of vaporized Si, $Si_2C$ and $SiC_2$, a source powder is used having a selected grain size distribution, with substantially the same desired polytype as the seed crystal. Further, the source is fed by various means to maintain essentially constant source characteristics.

Davis et al. also describe the use of a monocrystalline seed of desired polytype with off-axis growth face as previously described by Tairov, and manipulation of the source temperature to maintain a constant temperature gradient between the subliming source powder and the growth surface as would be obvious to those with ordinary experience in crystal growth.

Practical device fabrication processes require silicon carbide wafers to be large diameter, typically a wafer diameter of 5 cm or larger is required. In general, large diameter silicon carbide seeds having the requisite crystallographic quality are not available. Silicon carbide platelets, grown by the Lely process can be obtained with the requisite quality, however, the platelets are quite small, with a typical platelet measuring 5 mm in diameter, although occasionally platelets may be as large as 10 mm diameter. These silicon carbide platelets are commonly used as seeds in the growth of large diameter boules, by arranging the growth cavity geometry in such a manner to encourage increasing diameter as the boule is grown.

However, the growth of the larger diameter boule from the smaller diameter platelet almost always introduces catastrophic crystalline defects into the crystal. Although the central portion of the grown boule situated directly beneath the seed may retain the crystal perfection of the seed, the enlarged outer portion of the boule frequently contains low angle boundaries, dislocation arrays, and with pores and micropores located along the (0001) growth direction.

Although a logical solution would be to use a large seed cut from the large boule, the defects found in the seed are continued in the grown crystal. It is clear, then, that a process is needed that will yield high quality large diameter boules suitable for practical device fabrication.

SUMMARY OF THE INVENTION

An improved method is provided for yielding high quality large diameter boules suitable for practical device fabrication. The preferred method of growth is performed in two stages. In the first stage, a large diameter seed of requisite quality for boule growth is grown. In the second stage, this large diameter seed is used to grow a large diameter boule.

The furnace utilized with the present preferred method has a crucible with a cavity therein. The crucible cavity has within it first and second spaced-apart regions. The crucible cavity of the furnace is capable of being heated, preferably by induction or resistance heating, with insulation placed around the crucible and crucible cavity.

A source material of silicon carbide is provided at the first region of the crucible cavity. Next, a monocrystalline seed is placed at the second region of the crucible cavity.

In the first stage, the seed growth stage, a small diameter (i.e., approximately 6–10 mm) seed crystal of requisite quality is heated within an isothermal cavity containing silicon carbide grain to a temperature greater than or equal to the sublimation temperature of silicon carbide. This physical geometry, which approximates the Lely cavity condition for growth of silicon carbide platelets, allows the seed to expand in diameter without significant growth in thickness. This size diameter seed crystal is preferred because larger diameter seeds having sufficient qualities have been heretofore unavailable, while smaller diameter seed crystals are difficult to cool.

The preferred seed is a Lely platelet grown with a hexagonal or rhombohedral crystallographic structure. Growth in a geometry approaching isothermal condition (Lely condition) results in growth in the a-axis crystallographic direction to expand the diameter. The growth of the seed under the nearly isothermal conditions results in large diameter having the requisite quality for boule growth.

The second stage, or boule growth stage, is similar to boule growth techniques known in the prior art. In the second growth stage, a temperature gradient is provided between the seed and the subliming grain with the seed at a lower temperature than the temperature of the subliming grain. Growth is in the c-axis direction to provide a large diameter crystalline boule with the requisite crystallographic quality of the preferred seed.

The objects and advantages of this teaching will become apparent from a description of certain present preferred embodiments thereof shown in the drawings.

DETAILED DESCRIPTION OF THE PREFERRED EMBODIMENT

Figure 1:
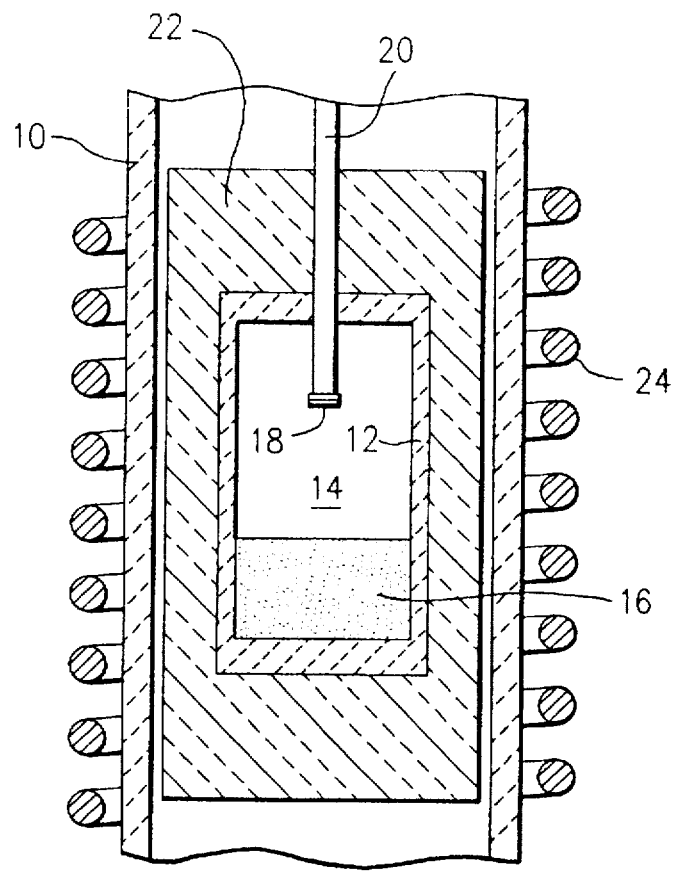
FIG. 1 is a schematic representation of a furnace for growing large silicon carbide crystals.

To better understand the operation of the preferred method of the present invention, a brief description of a single stage prior art of growing silicon carbide crystals is provided. Thus, referring to FIG. 1, a schematic representation of a system 10 is shown in which the prior art method for the growth of silicon carbide crystals may be conducted. The present preferred method may also be conducted in system 10. This silicon carbide growth system 10 includes a closed-end carbon susceptor or crucible 12. Graphite is selected as the preferred form of carbon used as the material for the crucible 12. A cavity 14 is formed within the crucible 12, so as to be bounded by the walls of the crucible. It is within the cavity 14 that the sublimation and condensation of vapors takes place.

A single crystal seed is then attached to the upper region of the crucible cavity 14, while source of silicon carbide grain is positioned in the lower region of the crucible cavity. However, the positions of source and seed may be reversed, i.e., the source may be placed at the top of the crucible cavity and the seed placed at the bottom of the crucible cavity. Preferably, the crucible and crucible cavity have a generally cylindrical shape.

The furnace 10 also includes means for heating the crucible 12. The crucible 12 is heated by any suitable means, such as an induction coil 24. The crucible/susceptor 12 is thermally insulated by thermal insulation 22. The thermal insulation 22 may be any suitable insulating material. However, it is preferred that the thermal insulation 22 be a material which is not significantly affected by the inductive field produced by the induction coil 24. Preferably, a foamed carbon material is used as the material for the thermal insulation 22.

The growth system, i.e., the source 16 and seed crystal 18 are positioned within the crucible cavity 14. It is preferred that the growth system 12, 22 be provided within a vacuum-tight enclosure 10. Coaxial cylindrical quartz tubes with a cooling water flow between the tubes provides the preferred vacuum-tight enclosure 10.

Single-stage physical vapor transport growth for a silicon carbide crystal occurs in the following manner: a single-crystal seed 18 of single polytype, preferably but not limited to 6H or 4H polytype, is attached to the underside of the seed holder 20 by means of a suitable mechanical device or adhesive. The lower section of the crucible 12 is filled with the source 16 of silicon carbide grain. This silicon carbide grain should be essentially pure, but may contain certain specific impurities as an aid to transport and growth. The silicon carbide grain need not be a specific polytype, nor need the grain be a specific grain size, nor need the silicon carbide grain be a specific mixture of grain sizes or geometric spacing of different grain sizes.

Prior to growth, the system 10 is typically heated to a temperature and provided a vacuum sufficient to remove absorbed gases. The system 10 is then filled with pure argon gas to a pressure greater than 100 torr but less than atmospheric. Next, the temperature is increased to approximately the 2100° to 2400° C. region where a partial vapor pressure from the silicon carbide source 16 exists. A temperature gradient may then be provided between the top and bottom of the crucible 12.

After thermal equilibrium is achieved, the pressure is slowly reduced to the range of 0.1 to 50 torr. The final pressure is selected that will achieve a significant growth rate and good quality crystal. After a period of growth ranging from four hours to more than forty-eight hours, depending on the quantity of the source material, the sublimation rate, and the amount of crystal desired, the growth is stopped by increasing the pressure of the argon inert gas and reducing the temperature.

The present preferred method will now be described with reference to FIGS. 1, 2a and 2b. The preferred method of growing the silicon carbide crystal of the present invention involves two stages: a near isothermal seed growth stage (shown in FIG. 2a), and a boule growth stage under conditions using a temperature gradient (shown in FIG. 2b).

Figure 2A:
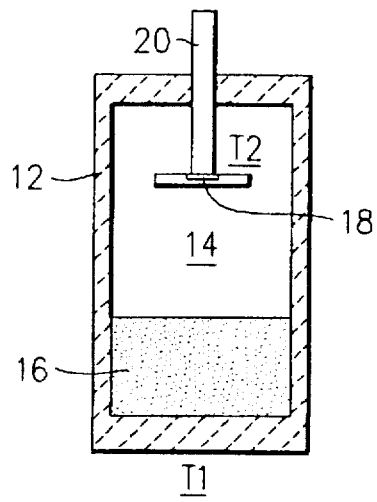
FIG. 2a is a schematic depiction of a first stage of growth for the preferred method of growing silicon carbide crystals.

Referring first to FIG. 2a, the first stage, referred to as the seed crystal growth stage, consists of growing a requisite quality seed to larger diameter. This is preferably done by providing a silicon carbide source 16 at a first region (preferably at the bottom) of the susceptor cavity 14. Then, a small seed having a highly perfect crystallographic crystal structure (preferably a Lely grown platelet) is mounted in a second region (preferably at the top) of the susceptor cavity 14. Although the source 16 is preferably provided at the bottom of the susceptor cavity 14 and the seed 18 is preferably provided at the top of the susceptor cavity, it is distinctly understood that the source 16 and seed 18 may be placed at any two regions of the susceptor cavity 14.

The seed crystal used in the first stage is preferably approximately 6–10 mm in diameter. Seed crystals much smaller than 6 mm will be difficult to cool. Seed crystals much larger than 10 mm generally have not been of sufficient quality to use for this purpose.

An induction heater is preferably utilized as a primary heating means 24 to initiate sublimation from the silicon carbide source 16. Sublimation in the first growth stage (the seed crystal growth stage) is conducted under isothermal conditions in which the temperature of the source (designated as T1 in the Figures) is the same as the temperature of the seed (designated as T2 in the Figures). Thus during the seed crystal growth stage, T1=T2. T1 and T2 are preferably held at approximately 2200° to 2500° C.

The seed growth stage is preferably carried out under low deposition rates of approximately 5 μm/hr to insure high crystalline perfection. The seed crystal growth stage causes the crystal to grow in the a-axis direction, as depicted in FIG. 2a. This near isothermal seed growth stage is continued until a large platelet area has been formed. A typical initial platelet seed diameter may be approximately 8 mm, whereas the grown platelet seed may be approximately 25 to 50 mm in diameter.

The substantially isothermal conditions are preferably maintained at high temperatures consistent with the sublimation temperature of the silicon carbide source. The substantially isothermal high temperature condition is preferably achieved by induction heating of the crucible and selected placement of thermal insulation surrounding the crucible and crucible cavity. Alternatively, the substantially isothermal high temperature condition may be achieved by a suitable crucial susceptor and selected placement of thermal insulation surrounding the crucible and crucible cavity. Also, the substantially isothermal high temperature condition may be achieved by resistance heating of the crucible and selected placement of thermal insulation surrounding the crucible and crucible cavity.

Figure 2B:
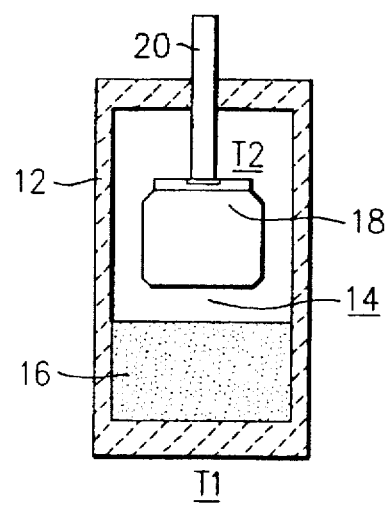
FIG. 2b is a schematic depiction of a second stage of growth for the preferred method of growing silicon carbide crystals.

Referring next to FIG. 2b, during the second stage of crystal growth, referred to as the boule growth stage, a temperature gradient is provided within the susceptor cavity so that the temperature of the seed (T2) is lower than the remainder of the susceptor components and is particularly lower than the temperature of the source (T1) during crystal growth. Thus, during the boule growth stage, T1>T2. Boule growth conducted in the second stage of crystal growth is similar to boule growth techniques known in the prior art and previously described herein.

Preferably, the source temperature T1 is maintained at a temperature of approximately 2100° C. to 2400° C. and the seed temperature T2 is maintained at a temperature of approximately 2000° C. to 2350° C. The temperature gradient is preferably approximately 25° C./cm. The boule growth stage is preferably carried out under deposition rates of 0.1 to 5 mm/hr. The boule growth stage causes the crystal to grow in the c-axis direction, as seen in FIG. 2b.

Any suitable means for achieving the thermal gradient may be employed. For example, the induction coil 24 may be moved axially relative to the crucible 12 to produce a temperature difference between the top and the bottom of the crucible 12. Temperature gradients as low as 10° C./cm and as high as 60° C./cm are suitable for the deposition of silicon carbide on the seed crystal 18. Also, the temperature gradient may be achieved by other means such as auxiliary heating provided proximate to the first crucible region. This auxiliary heating means may be one or more induction heating coils that are provided around the furnace near the first susceptor region.

Thus, in summary, the preferred method for growing crystals is as follows. In the first stage (i.e., the seed growth stage), the sublimation is conducted isothermally in the furnace, causing the seed to grow in the a-axis direction to a larger diameter. The seed crystal growth causes a wide, flat seed crystal of requisite quality to be grown. Next, in the second stage (i.e., the boule growth stage), the sublimation is conducted under a thermal gradient in which the seed has a lower temperature than the remaining components in the cavity, including the source. This stage results in the growth of the length of the crystal in the c-axis direction.

While certain present preferred embodiments have been shown and described, it is distinctly understood that the invention is not limited thereto but may be otherwise embodied within the scope of the following claims.

It is claimed:

1. A method for producing crystals of silicon carbide in a furnace, wherein the furnace has a crucible with a cavity therein, means for heating the crucible cavity, and first and second spaced-apart regions of the crucible cavity, the method comprising the steps of:

providing a source material of silicon carbide having a sublimation temperature at the first region of the crucible cavity;

providing a monocrystalline seed at the second region of the crucible cavity;

conducting a first growth stage in which the first region and the second region of the crucible cavity are heated to at least the sublimation temperature of silicon carbide under substantially isothermal conditions; and conducting a second growth stage in which a temperature gradient is provided between the first and the second region of the crucible cavity, such that the seed in the second crucible region is kept at a temperature lower than a temperature of the first crucible region.

2. The method of claim 1 wherein the substantially isothermal conditions are maintained at high temperature consistent with the sublimation temperature of the silicon carbide source.

3. The method of claim 2 wherein the substantially isothermal high-temperature condition is achieved by induction heating of the crucible and selected placement of thermal insulation surrounding the crucible and crucible cavity.

4. The method of claim 2 wherein the substantially isothermal high-temperature condition is achieved by a suitable crucible susceptor and selected placement of thermal insulation surrounding the crucible and crucible cavity.

5. The method of claim 2 wherein the substantially isothermal high-temperature condition is achieved by resistance heating and selected placement of thermal insulation surrounding the crucible and crucible cavity.

6. The method of claim 1 wherein the temperature gradient between the first region of the cavity containing the source and the second region of the crucible cavity containing the seed is a value from 10° C./cm to 50° C./cm.

7. The method of claim 6 wherein the temperature gradient between the first region of the cavity containing the source, and the second region of the crucible cavity containing the seed is approximately 25° C./cm during the second growth stage.

8. The method of claim 1 wherein the temperature gradient is achieved by providing for movement of an axially concentric induction coil.

9. The method of claim 1 wherein the temperature gradient is achieved by means of auxiliary heating provided proximate the first region of the crucible cavity.

10. The method of claim 9 wherein the auxiliary heating means is comprised of at least one induction heating coil provided around the furnace around the first region of the crucible cavity.

11. The method of claim 1 wherein the first and second regions are heated to a temperature of approximately 2200° C. to 2500° C. during the first growth stage.

12. The method of claim 1 wherein the first region is heated to a temperature of approximately 2100° C. to 2400° C. during the second growth stage.

13. The method of claim 12 wherein the second region is heated to a temperature of approximately 2000° C. to 2350° C. during the second growth stage.

14. The method of claim 1 wherein the monocrystalline seed provided at the second region of the crucible cavity has a diameter of approximately 6–10 mm.

* * * * *